United States Patent
Woo et al.

(10) Patent No.: US 11,930,686 B2
(45) Date of Patent: Mar. 12, 2024

(54) ELECTRONIC DEVICE INCLUDING CAMERA MODULE

(71) Applicant: SAMSUNG ELECTRONICS CO., LTD., Suwon-si (KR)

(72) Inventors: Sunggwan Woo, Suwon-si (KR); Kyeongeun Lee, Suwon-si (KR); Changkeun Kim, Suwon-si (KR); Jaecheol Bae, Suwon-si (KR); Sungho Ahn, Suwon-si (KR); Bowon Jung, Suwon-si (KR); Songhee Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 17/014,325

(22) Filed: Sep. 8, 2020

(65) Prior Publication Data

US 2021/0074780 A1    Mar. 11, 2021

(30) Foreign Application Priority Data

Sep. 6, 2019    (KR) .................. 10-2019-0110637

(51) Int. Cl.
*H10K 59/65* (2023.01)
*G02B 7/02* (2021.01)
(Continued)

(52) U.S. Cl.
CPC ............ *H10K 59/65* (2023.02); *G02B 7/021* (2013.01); *H04B 1/3827* (2013.01);
(Continued)

(58) Field of Classification Search
CPC .. G06F 1/1686; H04N 5/2257; H04N 5/2252; H04N 23/51; G02B 7/021; H10K 59/65
See application file for complete search history.

(56) References Cited

U.S. PATENT DOCUMENTS

| 6,414,337 B1 | 7/2002 | Day et al. |
| 10,754,373 B2 | 8/2020 | Kwak et al. |

(Continued)

FOREIGN PATENT DOCUMENTS

| CN | 107241466 A | 10/2017 |
| CN | 110062082 A | 7/2019 |

(Continued)

OTHER PUBLICATIONS

International Search Report dated Dec. 23, 2020 in corresponding International Application No. PCT/KR2020/012039.

(Continued)

*Primary Examiner* — Suberr L Chi
(74) *Attorney, Agent, or Firm* — Nixon & Vanderhye P.C.

(57) ABSTRACT

According to various embodiments, an electronic device may include a housing, a display disposed in an internal space of the housing and viewable from an outside and including a display area, and a camera module disposed under the display overlapping at least a part of the display area and not including an aperture structure, wherein the camera module includes a lens housing, a plurality of lenses disposed on the lens housing, and an image sensor disposed under the plurality of lenses, wherein the display includes a display panel and a light blocking member comprising a light blocking material and including a light transmission region disposed on an inside and/or an outside of the display panel overlapping at least parts of the plurality of lenses as viewed from above the display.

17 Claims, 11 Drawing Sheets

(51) Int. Cl.
  *H04B 1/3827* (2015.01)
  *H04N 23/51* (2023.01)
  *H10K 50/84* (2023.01)
  *H10K 50/86* (2023.01)
  *H10K 50/87* (2023.01)
  *H10K 59/12* (2023.01)
  *H10K 59/40* (2023.01)
  *H01L 27/146* (2006.01)

(52) U.S. Cl.
  CPC ............. *H04N 23/51* (2023.01); *H10K 50/84* (2023.02); *H10K 50/86* (2023.02); *H10K 50/87* (2023.02); *H10K 59/12* (2023.02); *H10K 59/40* (2023.02); *H01L 27/14623* (2013.01); *H01L 27/14627* (2013.01)

(56) References Cited

U.S. PATENT DOCUMENTS

| | | | |
|---|---|---|---|
| 2017/0068287 A1 | 3/2017 | Jung et al. | |
| 2017/0186891 A1 | 6/2017 | Min | |
| 2017/0287992 A1 | 10/2017 | Kwak et al. | |
| 2018/0151834 A1 | 5/2018 | Kanaya | |
| 2019/0012544 A1* | 1/2019 | Park | G06V 10/147 |
| 2019/0073505 A1 | 3/2019 | Kwon et al. | |
| 2019/0243417 A1 | 8/2019 | Cheng | |
| 2020/0236259 A1 | 7/2020 | Nakamura et al. | |
| 2021/0051221 A1 | 2/2021 | Sim et al. | |

FOREIGN PATENT DOCUMENTS

| | | |
|---|---|---|
| CN | 110112200 A | 8/2019 |
| CN | 110149470 | 8/2019 |
| EP | 3 977 714 A1 | 4/2022 |
| KR | 2002-0077380 | 10/2002 |
| KR | 10-2017-0111827 A | 10/2017 |
| KR | 10-2019-0000522 A | 1/2019 |
| WO | WO 2018/216545 A1 | 11/2018 |
| WO | WO 2021/033919 A1 | 2/2021 |

OTHER PUBLICATIONS

Extended European Search Report dated Jul. 21, 2022 for EP Application No. 20860351.4.
Korean Office Action dated Jan. 15, 2024 for KR Application No. 10-2019-0110637.

* cited by examiner

US 11,930,686 B2

ELECTRONIC DEVICE INCLUDING CAMERA MODULE

CROSS-REFERENCE TO RELATED APPLICATION

This application is based on and claims priority under 35 U.S.C. § 119 to Korean Patent Application No. 10-2019-0110637 filed on Sep. 6, 2019, in the Korean Intellectual Property Office, the disclosure of which is incorporated by reference herein in its entirety.

BACKGROUND

Field

The disclosure relates to an electronic device including a camera module.

Description of Related Art

An electronic device, for example, a portable electronic device, has been released with various sizes in accordance with its functions and user's preference, and may include a large-screen touch display for wide visibility securing and convenience of operations. The electronic device may include at least one camera module. For example, the electronic device may include at least one camera module disposed around a display or disposed to overlap at least a part of the display.

An electronic device may include a display that can be seen from outside through at least a part of a cover member (e.g., front plate, glass window, or front cover). To meet the demand for a large screen, the display area may be gradually extended so that the display can be realistically viewed through the overall area of the cover member (e.g., front cover). In response to the extension of the display area, the disposition structure of various electronic components disposed through the cover member, for example, the disposition structure of at least one camera module, may be changed accordingly. If the camera module is disposed in an area (e.g., black matrix (BM) area or inactive area) excluding the display area of the cover member, the extension of the display area may be restricted.

In order to accommodate the extension of the display area and to smoothly dispose the electronic components, the display may include an opening (e.g., punch hole or perforated hole) that is formed in a location facing the camera module. The camera module may perform its function through the opening of the display and through a camera exposure area (formed by a printing area) formed on the cover member. The size of the camera exposure area may be determined by the size of an outer diameter of a barrel member of the camera module including a plurality of lenses. However, the barrel member supporting the lenses may be limited in reducing the overall outer diameter of the barrel member due to the limited design structure of the thickness supporting the lens, and as a result, it may be difficult to reduce the camera exposure area formed on the cover member.

SUMMARY

Embodiments of the disclosure provide an electronic device including a camera module.

Embodiments of the disclosure provide an electronic device including a camera module configured to have a relatively small camera exposure area even with the same viewing angle.

Embodiments of the disclosure provide an electronic device including a camera module capable of helping the extension of the display area through the relatively small camera exposure area.

According to various example embodiments, an electronic device may include: a housing; a display disposed in an internal space of the housing to be viewable from an outside and including a display area; and a camera module disposed under the display and overlapping at least a part of the display area, the camera module not including an aperture structure, the camera module including: a lens housing; a plurality of lenses disposed on the lens housing; and an image sensor disposed under the plurality of lenses, and wherein the display includes a display panel and a light blocking member comprising a light blocking material including a light transmission aperture disposed on an inside and/or an outside of the display panel and overlapping at least parts of the plurality of lenses as viewed from an above the display.

Effects that can be obtained in the disclosure are not limited to the above-described effects, and other effects can be clearly understood by those of ordinary skill in the art to which the disclosure pertains from the following detailed description.

BRIEF DESCRIPTION OF THE DRAWINGS

The above and other aspects, features and advantages of certain embodiments of the disclosure will be more apparent from the following detailed description, taken in conjunction with the accompanying drawings, in which.

DETAILED DESCRIPTION

The following description is made with reference to the accompanying drawings and is provided to assist in a comprehensive understanding of various embodiments of the disclosure. It includes various specific details to assist in that understanding but these are to be regarded as merely examples. Accordingly, those of ordinary skill in the art will recognize that various changes and modifications of the various example embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various example embodiments of the disclosure is provided for illustration purpose only and not for the purpose of limiting the disclosure.

It is to be understood that the singular forms "a," "an," and "the" include plural referents unless the context clearly dictates otherwise. Thus, for example, reference to "a component surface" includes reference to one or more of such surfaces.

FIGS. 1, 2, 3, 4, 5, 6A, 6B, 7, 8, 9 and 10 (e.g., FIGS. 1 to 10), discussed below, and the various example embodiments used to describe various example embodiments of the disclosure are by way of illustration only and should not be construed in any way to limit the scope of the disclosure. Those skilled in the art will understand that the principles of the disclosure may be implemented in any suitably arranged system or device.

Hereinafter, example embodiments of the disclosure are described in greater detail with reference to accompanying drawings.

Figure 1:
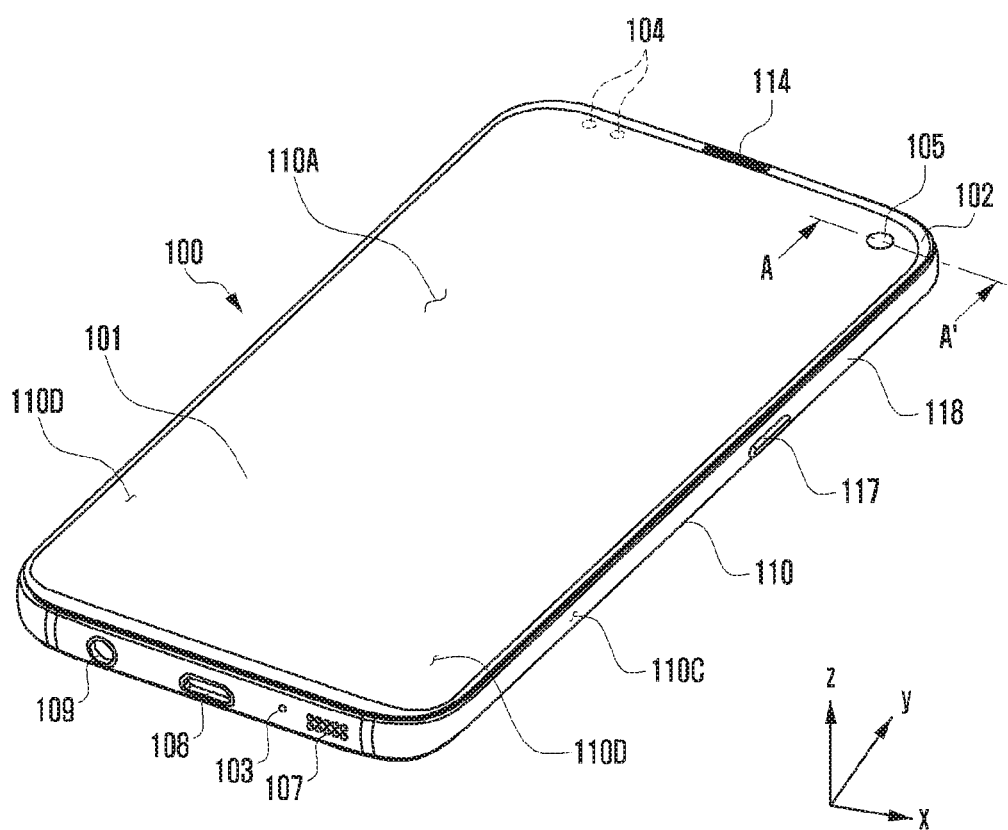
FIG. 1 is a front perspective view of an example mobile electronic device according to various embodiments of the disclosure.
Figure 2:
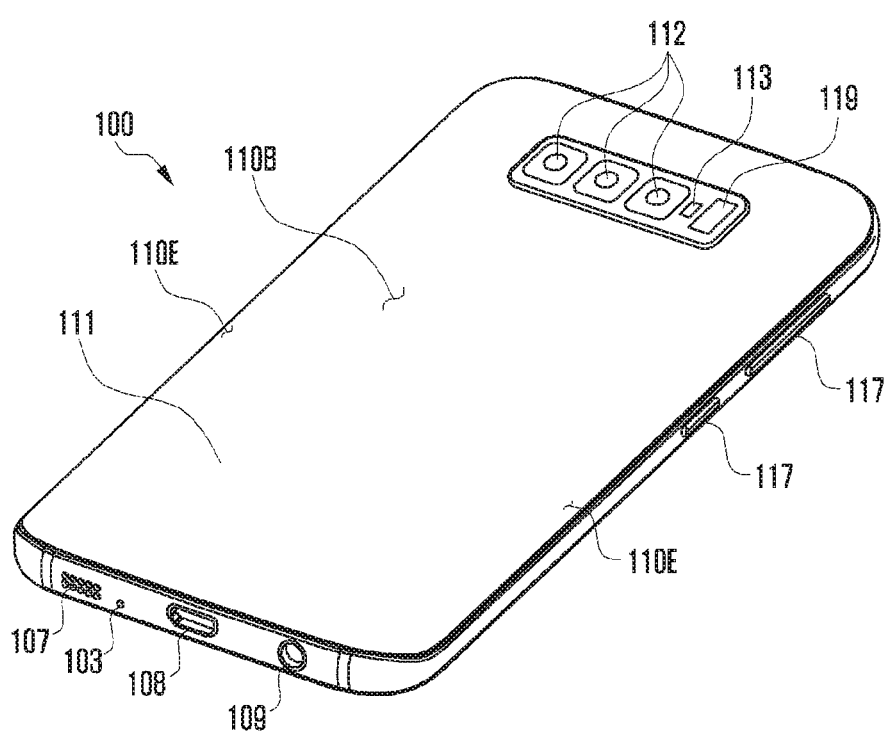
FIG. 2 is a rear perspective view of the electronic device of FIG. 1 according to various embodiments of the disclosure.

FIG. 1 is a front perspective view of an example mobile electronic device according to an embodiment of the disclosure, and FIG. 2 is a rear perspective view of the mobile electronic device illustrated in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be viewable through a substantial portion of the front plate 102, for example. At least a part of the display 101 may be viewable through the front plate 102 that forms the first surface 110A and the first region 110D of the lateral surface 110C. Outlines (e.g., edges and corners) of the display 101 may have substantially the same form as those of the front plate 102. The spacing between the outline of the display 101 and the outline of the front plate 102 may be substantially unchanged in order to enlarge the viewable area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be visually exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
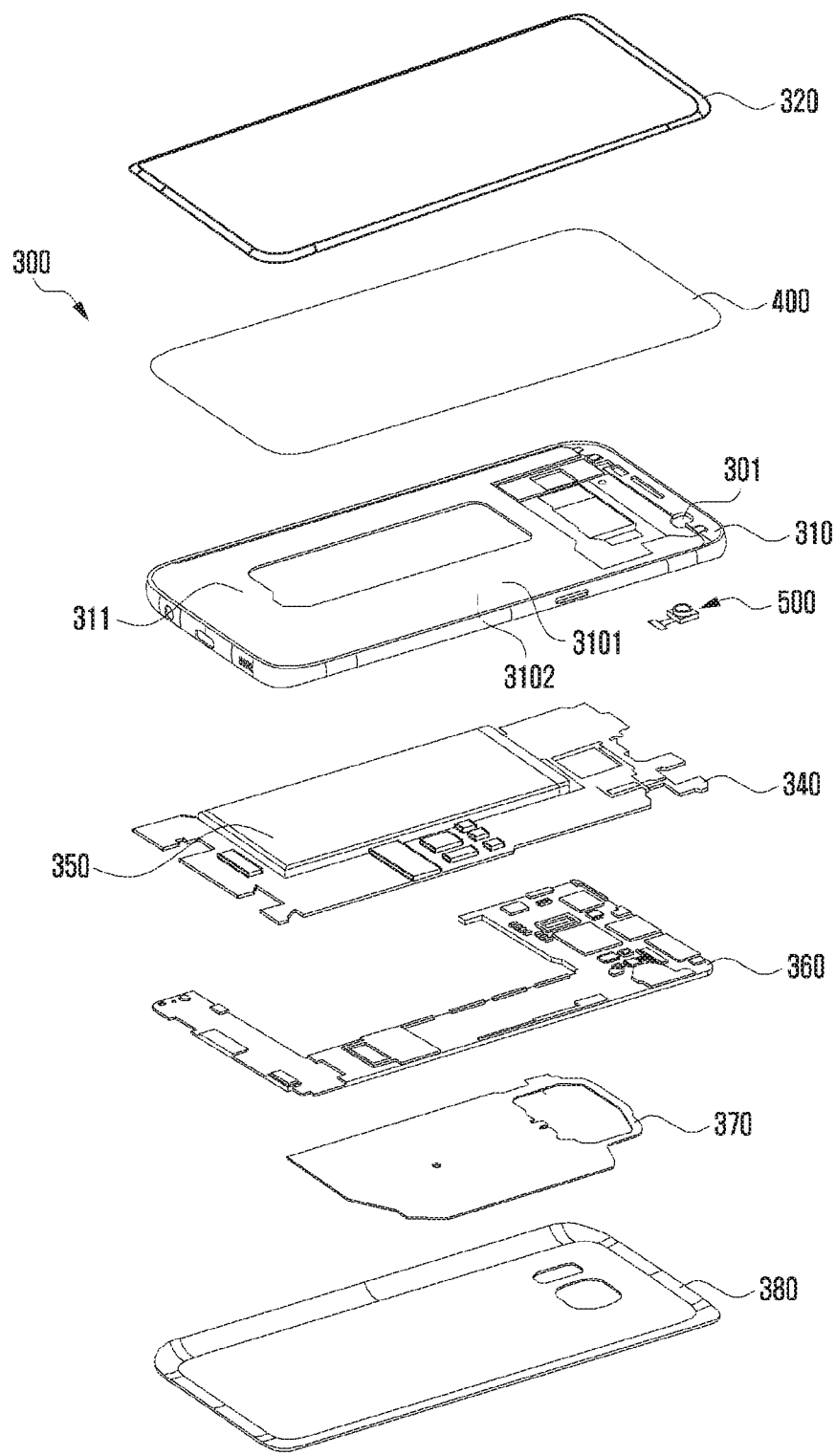
FIG. 3 is an exploded perspective view of the electronic device of FIG. 1 according to various embodiments of the disclosure.

FIG. 3 is an exploded perspective view of a mobile electronic device shown in FIG. 1 according to an embodiment of the disclosure.

Referring to FIG. 3, a mobile electronic device 300 may include a lateral bezel structure 310, a first support member 311 (e.g., a bracket), a front plate 320, a display 400, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof may not be repeated below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 400 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

According to various embodiments, a first support member 311 of a side member (e.g., bezel) 310 may include a first surface 3101 directed towards a front plate 320 and a second surface 3102 directed in an opposite direction (e.g., rear plate direction) to the first surface 3101. According to an embodiment, a camera module 500 (e.g., camera module 105 of FIG. 1) may be disposed between a first support member 311 and a rear plate 380. According to an embodiment, the camera module 500 may be disposed to project or to be seen in a direction of the front plate 320 through a through-hole 301 connected from the first surface 3101 to the second surface 3102 of the first support member 311. According to an embodiment, a portion projecting through the through-hole 301 of the camera module 500 may be disposed to detect an external environment in a location corresponding to a display 400. As another embodiment, if the camera module 500 is disposed between the display 400 and the first support member 311, the through-hole 301 may be unnecessary.

Hereinafter, the disposition relationship between the display 400 and the camera module 500 in an electronic device 300 will be described in greater detail.

Figure 4:
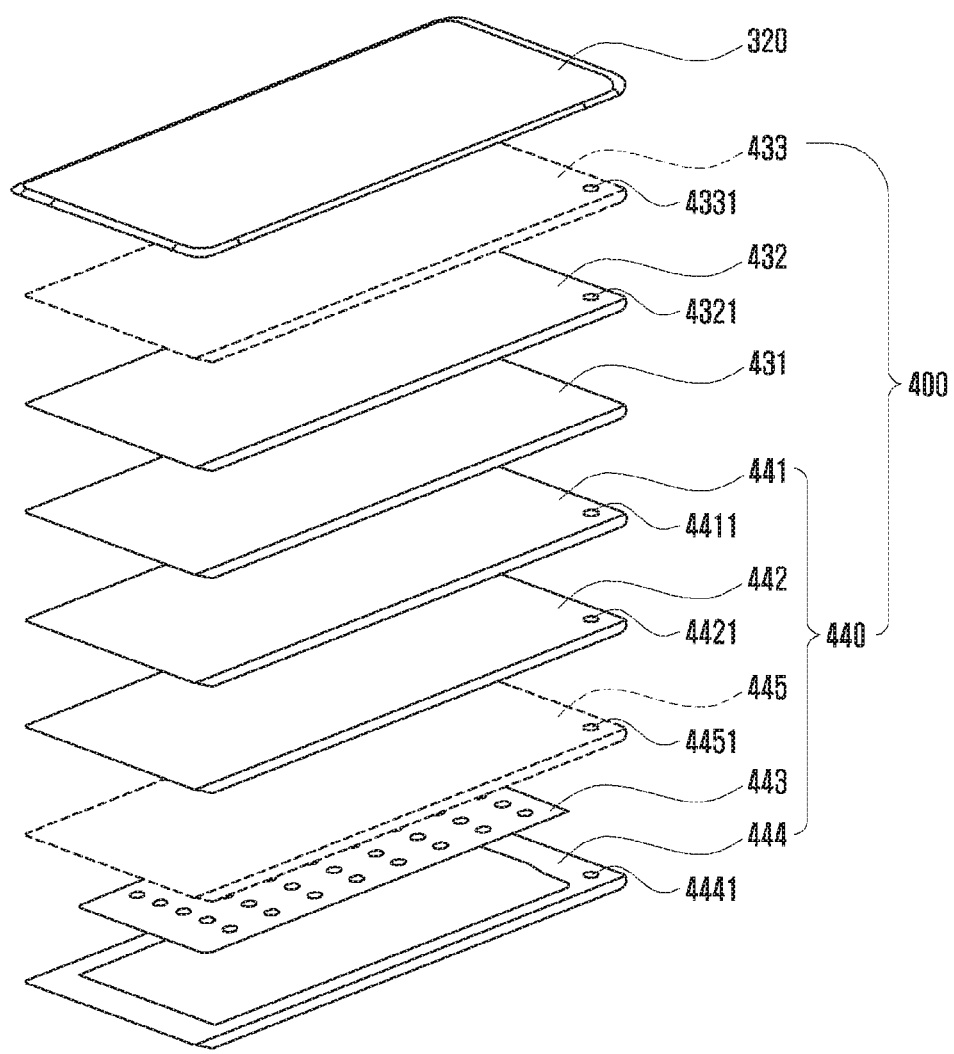
FIG. 4 is an exploded perspective view of a display according to various embodiments of the disclosure.

FIG. 4 is an exploded perspective view of a display 400 according to various embodiments of the disclosure.

The display 400 of FIG. 4 may be at least partly similar to the display 101 of FIG. 1, or may further include another embodiment of the display.

With reference to FIG. 4, the display 400 may include a polarizer (POL) 432 (e.g., polarizing film) disposed on a rear surface of a front cover 320 (e.g., front plate, glass plate, first cover member, or cover member) through an adhesive member (e.g., adhesive member 410 of FIG. 5), and at least one subsidiary material layer 440 attached to a rear surface of the display panel 431. According to an embodiment, the adhesive member may include an optical clear adhesive (OCA), a pressure sensitive adhesive (PSA), a thermo-reactive adhesive, a general adhesive, or a double sided tape. According to an embodiment, the display panel 431 and the POL 432 may be integrally formed.

According to various embodiments, the display 400 may include a control circuit (not illustrated). According to an embodiment, the control circuit may include a flexible printed circuit board (FPCB) electrically connecting a main printed circuit board (e.g., printed circuit board 340 of FIG. 3) of an electronic device (e.g., electronic device 300 of FIG. 3) and the display panel 431 with each other, and a display driver IC (DDI) mounted on the FPCB. According to an embodiment, the display 400 may additionally include a touch panel 433. According to an embodiment, in case that the display 400 operates as an in-cell type or on-cell type touch display in accordance with the disposition location of the touch panel 433, the control circuit may include a touch display driver IC (TDDI). As another embodiment, the display 400 may include a fingerprint sensor (not illustrated) disposed around the control circuit. According to an embodiment, the fingerprint sensor may include an ultrasonic or optical fingerprint sensor capable of recognizing the fingerprint of a finger contacting or approaching from an outer surface of the front cover 320 through a hole formed at least partly on some constituent elements of the display 400.

According to various embodiments, the at least one subsidiary material layer 440 may include at least one polymer member 441 and 442 disposed on the rear surface of the display panel 431, at least one functional member 443 disposed on a rear surface of the at least one polymer member 441 and 442, and a conductive member 444 disposed on a rear surface of the at least one functional member 443. According to an embodiment, the at least one polymer member 441 and 442 may include a shading layer 441 (e.g., black layer including an uneven pattern) for removing bubbles that may be generated between the display panel 431 and its lower attachments and blocking light created from the display panel 431 or incident from an outside and/or a buffer layer 442 disposed to buffer impacts. According to an embodiment, the at least one functional member 443 may include a heat dissipation sheet (e.g., graphite sheet) for heat dissipation, an added display, a force touch FPCB, a fingerprint sensor FPCB, an antenna radiator for communication, conductive/non-conductive tape, or an open cell sponge. According to an embodiment, the conductive member 444, may include, for example, a metal plate, may be used to provide stiffness reinforcement of the electronic device (e.g., electronic device 300 of FIG. 3), to shield surrounding noises, and to disperse heat emitted from surrounding heat emission components. According to an embodiment, the conductive member 444 may include Cu, Al, Mg, SUS, CLAD, or the like (e.g., lamination member on which SUS and Al are alternately disposed). As another embodiment, the display 400 may further include a detection member 445 to detect an input by an electromagnetic induction type writing member (e.g., electronic pen). According to an embodiment, the detection member 445 may include a digitizer. According to an embodiment, the detection member 445 may be disposed between the at least one polymer member 442 and the functional member 443. As another embodiment, the detection member 445 may be disposed between the display panel 431 and the at least one polymer member 441.

According to various embodiments, the display 400 may be disposed inside the display panel 431, between the display panel 431 and the POL 432, or between the display panel 431 and the subsidiary material layer 440, and may include a light blocking member (e.g., light blocking member 460 of FIG. 6A) serving as an aperture. According to an embodiment, the light blocking member 460 is disposed closer to the camera module (e.g., camera module 500 of FIG. 5) than the existing printing area to minimize and/or reduce the viewing angle, and thus the size of a camera exposure area (e.g., circular BM area), which is seen from the outside of the front cover 320 through the light blocking member 460 serving as the aperture, may be reduced.

Figure 5:
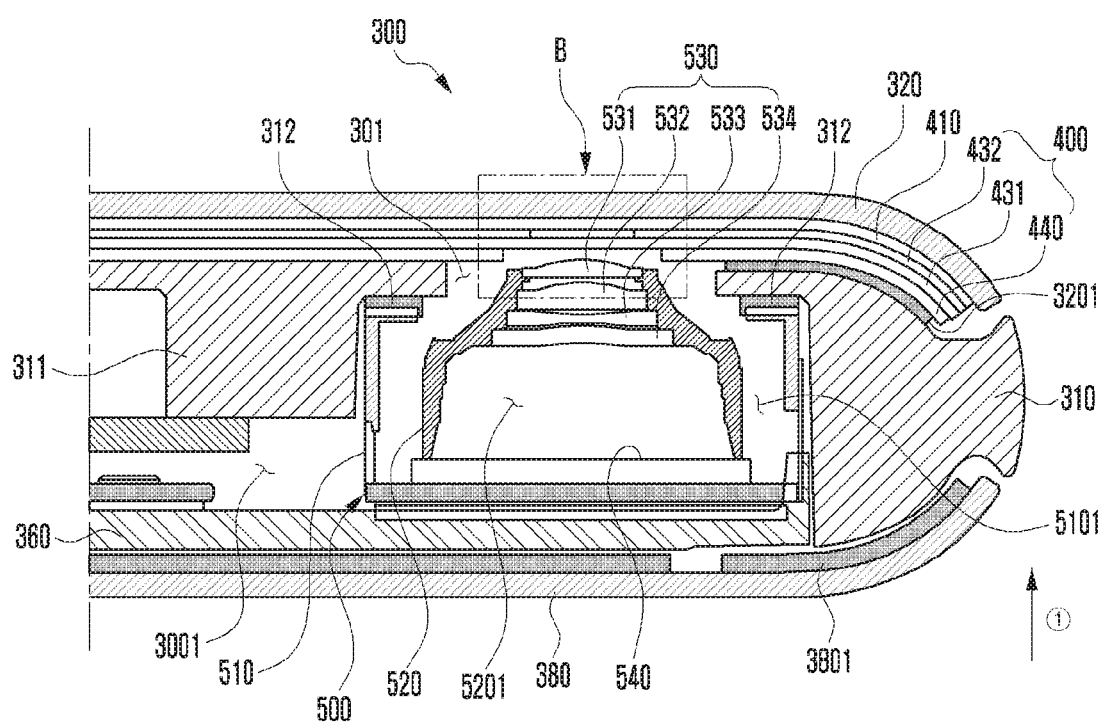
FIG. 5 is a partial cross-sectional view of an electronic device, taken along line A-A' of FIG. 1 according to various embodiments of the disclosure.

According to various embodiments, the subsidiary material layer 440 may include openings 4411, 4421, 4451, and 4441 formed in a location corresponding to the camera module (e.g., camera module 500 of FIG. 5). According to an embodiment, the camera module 500 may be disposed close to the rear surface of the display panel 431 through the openings 4411, 4421, 4451, and 4441. According to an embodiment, the POL 432 or the touch panel 433 disposed on the upper portion of the display panel 431 may also include openings 4321 and 4331 formed by perforating the corresponding location in order to prevent and/or reduce the performance of the camera module 500 from deteriorating due to the refractive index. As another embodiment, the POL 432 and/or the touch panel 433 may be processed so that the corresponding location to the camera module 500 becomes transparent or the polarizing characteristic thereof is removed. As another embodiment, the layers having no opening (e.g., display panel 431 or touch panel 433) may include coatings capable of being index-matched to minimize and/or reduce a difference in refractive index between the layers. According to various embodiments, the display 400 may include, for example, and without limitation, an organic light-emitting diode (OLED) display, a liquid crystal display (LCD), or the like.

FIG. 5 is a partial cross-sectional view of an electronic device, taken along line A-A' of FIG. 1 according to various embodiments of the disclosure.

In describing FIG. 5, an unbreakable (UB) type OLED display (e.g., curved display) will be used by way of non-limiting example, but the display is not limited thereto. For example, on-cell touch active matrix organic light-emitting diode (AOLED) (OCTA) type flat display, or the like, may be applied. With reference to FIG. 5, an electronic device 300 may include a front cover 320 (e.g., cover member, front plate, front window, or first plate) directed in a first direction (Q direction), a rear cover 380 (e.g., rear cover member, rear plate, rear window, or second plate) directed in an opposite direction to the front cover 320, and a side member (e.g., bezel) 310 surrounding a space 3001 between the front cover 320 and the rear cover 380. According to an embodiment, the electronic device 300 may include a first waterproof member 3201 disposed between the subsidiary material layer 440 of the display 400 and the side member 310. According to an embodiment, the electronic device 300 may include a second waterproof member 3801 disposed between the side member 310 and the rear plate 380. The first waterproof member 3201 and the second waterproof member 3801 may prevent and/or reduce external foreign substances or moisture from flowing into the internal space 3001 of the electronic device 300. As another embodiment, the waterproof member may be disposed on at least a part of a mount support structure between the camera module 500 and the side member 310. As another embodiment, the first waterproof member 3201 and/or the second waterproof member 3801 may be replaced by cohesive members.

According to various embodiments, the side member 310 may further include a first support member 311 at least partly extending in the internal space 3001 of the electronic device 300. According to an embodiment, the first support member 311 may be formed by a structural coupling to the side member 310. According to an embodiment, the first support member 311 may support the camera module 500 so that the camera module 500 is aligned and disposed around the rear surface of the display panel 431 through the opening (e.g., opening (OP) of FIG. 6A) of the subsidiary material layer 440 of the display 400.

According to various embodiments, the camera module 500 may include a camera housing 510, a lens housing 520 disposed in an internal space 5101 of the camera housing 510 and projecting at least partly in a display direction (e.g., ① direction), a plurality of lenses 530: 531, 532, 533, and 534 disposed at predetermined intervals in an internal space 5201 of the lens housing 520, and at least one image sensor 540 disposed to acquire at least a part of light having passed through the plurality of lenses 530: 531, 532, 533, and 534 in the internal space 5101 of the camera housing 510. According to an embodiment, in case the camera module 500 includes an autofocus (AF) function, the lens housing 520 may move to vary the distance from the display panel 431 through a specific driving unit in the camera housing 510. According to an embodiment, in order for the camera module 500 to perform the AF function, a separate driving unit may be disposed to change the location of at least one of the plurality of lenses 530. According to the camera module 500 as another embodiment, the camera housing 510 may be omitted, and the lens housing 520 may be directly disposed on the first support member 311 through a specific alignment process. According to an embodiment, in case of being directly disposed on the first support member 311, the camera housing 510 may be omitted to reduce the camera disposition space, and the lens housing 520 may be disposed to be attached to one side surface of the first support member 311. According to an embodiment, the camera module 500 may be aligned through a through-hole 301 of the first support member 311, and may be attached to the rear surface of the first support member 311 through an adhesive member 312 (e.g., bonding member or tape member).

According to various embodiments, the display 400 may include the touch panel (e.g., touch panel 433 of FIG. 4), the POL 432, the display panel 431, the shading layer 441, the buffer layer (e.g., buffer layer 442 of FIG. 4), the digitizer (e.g., digitizer 445 of FIG. 4), the functional member (e.g., functional member 443 of FIG. 4), and/or the conductive member (e.g., conductive member 444 of FIG. 4). According to an embodiment, the camera module 500 may be supported by a second support member 360 (e.g., rear case) additionally disposed in the internal space of the electronic device.

Figure 6A:
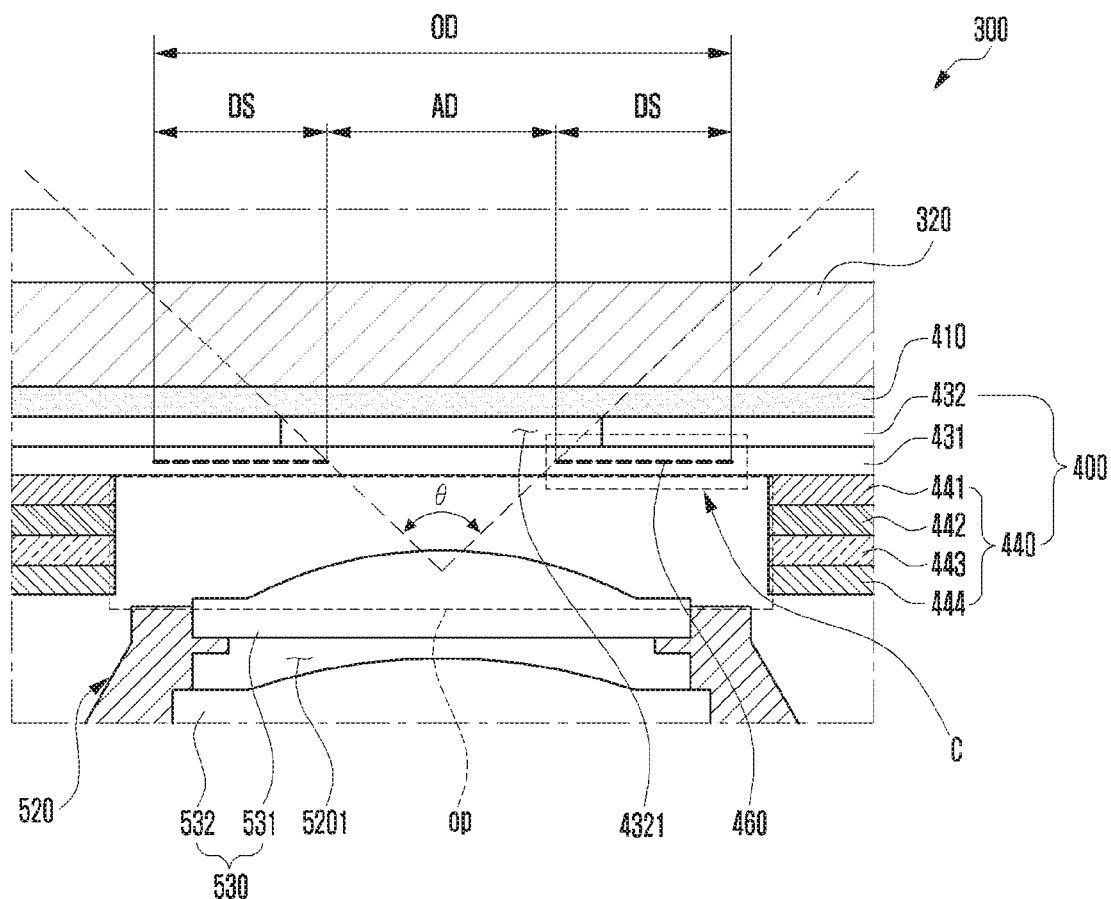
FIG. 6A is a partial cross-sectional view of an electronic device with an area B of FIG. 5 enlarged according to various embodiments of the disclosure.
Figure 6B:
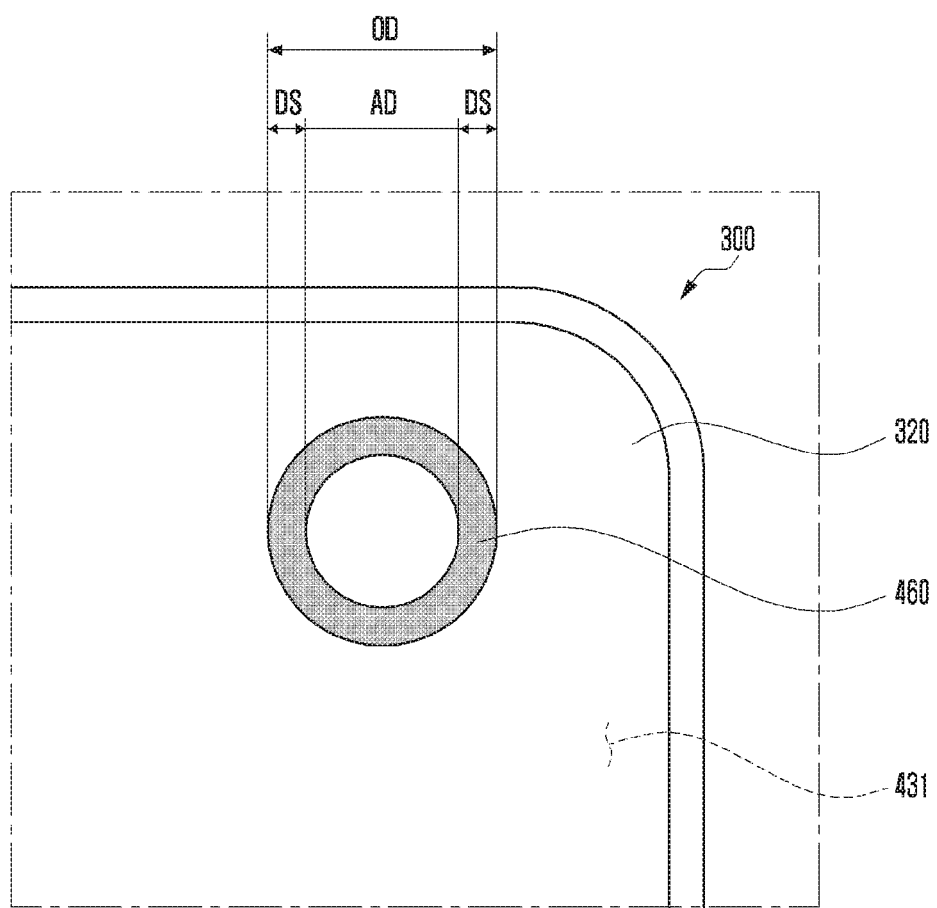
FIG. 6B is a partial plan view of an electronic device as seen from above a front cover according to various embodiments of the disclosure.

FIG. 6A is an enlarged view of an area B of FIG. 5 according to various embodiments of the disclosure. FIG. 6B is a partial plan view of an electronic device 300 as seen from above a front cover 320 according to various embodiments of the disclosure.

With reference to FIGS. 6A and 6B, the electronic device 300 may include the adhesive layer 410 disposed between the rear surface of the front cover 320 and the side member 310, the POL 432, the display panel 431, and the subsidiary material layer 440. According to an embodiment, as seen from above the front plate 320, the POL 432 may include the opening 4321 formed to improve optical permeability of the camera module 500. As another embodiment, a part of the adhesive member 410 disposed on the upper portion of the POL 432, which corresponds to the opening 4321 may also be omitted at least partly. As another embodiment, the opening 4321 formed on the POL 432 may be filled with a material to match the refraction index in accordance with an increase of interfacial reflection.

According to an embodiment, the area of the POL 432 corresponding to the plurality of lenses 530 may not include the opening 4321 formed thereon, and may be formed with high permeability. For example, at least a partial area (e.g., area corresponding to the plurality of lenses 530) of the POL 432 may be formed of a material having permeability different from the permeability of the other area of the POL 432, or may include another member capable of heightening the permeability. According to an embodiment, a member (not illustrated) for heightening the permeability may be disposed on at least a part (e.g., upper side surface or lower side surface) of the area corresponding to the plurality of lenses 530 of the POL 432. According to an embodiment, as seen from above the front cover 320, the subsidiary material layer 440 may include an opening OP formed on an area at least partly overlapping the plurality of lenses 530. According to an embodiment, the opening OP may be formed as one opening OP on the subsidiary material layer 440 by making the opening (e.g., opening 4411 of FIG. 4) formed on the shading layer 441, the opening (e.g., opening 4421 of FIG. 4) formed on the buffer layer 442, the opening (e.g., opening 4431 of FIG. 4) formed on the functional member 443, and the opening (e.g., opening 4441 of FIG. 4) formed on the conductive member 444 overlap one another. According to an embodiment, the respective openings may have different sizes corresponding to the shape of the camera module.

According to various embodiments, the display 400 may include at least one light blocking member (e.g., including a light blocking material) 460 disposed in the display panel 431. According to an embodiment, the light blocking member 460 (e.g., aperture) may include a light transmission region (e.g., a light transmission aperture) AD corresponding to an area overlapping an effective diameter of the lens 530. According to an embodiment, the overall outer diameter OD of the light blocking member 460 may be formed corresponding to the light transmission region AD and a blocking area DS (e.g., aperture area) forming the light transmission region AD. For example, the area of the light blocking member 460 may be formed as a sum of the light transmission region AD and the blocking area DS forming the light transmission region AD. For example, as seen from one side surface of the light blocking member 460, the outer diameter OD crossing the light blocking member 460 may be formed by the sum of the length AD crossing the light transmission region AD and the length DS crossing the blocking area. According to an embodiment, the size of the light transmission region AD or the blocking area DS may be determined by the size, disposition, and location of the lens 530. According to an embodiment, the size of the light transmission region AD of the light blocking member 460 may be determined based on a predetermined viewing angle θ of the lens 530 of the camera module 500. According to an embodiment, the blocking area DS of the light blocking member 460 may be determined to have a size enough to block the unnecessary light so that at least a part of the light flowing from outside or inside does not flow into the neighborhood of the light transmission region AD of the display panel 431. According to an embodiment, the light transmission region AD may be formed as an opening, and the opening may be formed by the blocking area DS. Through the formed opening, at least a part of external light outside the electronic device may flow in and may be transferred to the image sensor 540 through the lens 530. The amount of light flowing into the image sensor may be determined by the aperture, and as the size of the light transmission region AD is increased, a larger amount of light may flow into the image sensor.

According to various embodiments, the display panel 431 may be configured so that pixels and/or wirings are not disposed on the area overlapping the light transmission region AD to improve the optical permeability as seen from above the front cover 320. As another embodiment, as seen from above the front cover 320, the display panel 431 may be configured so that the area overlapping the light transmission region (AD) has a lower pixel density and/or a lower wiring density than the pixel density and/or the wiring density of a neighboring active area (e.g., active area) to improve the optical permeability.

Figure 7:
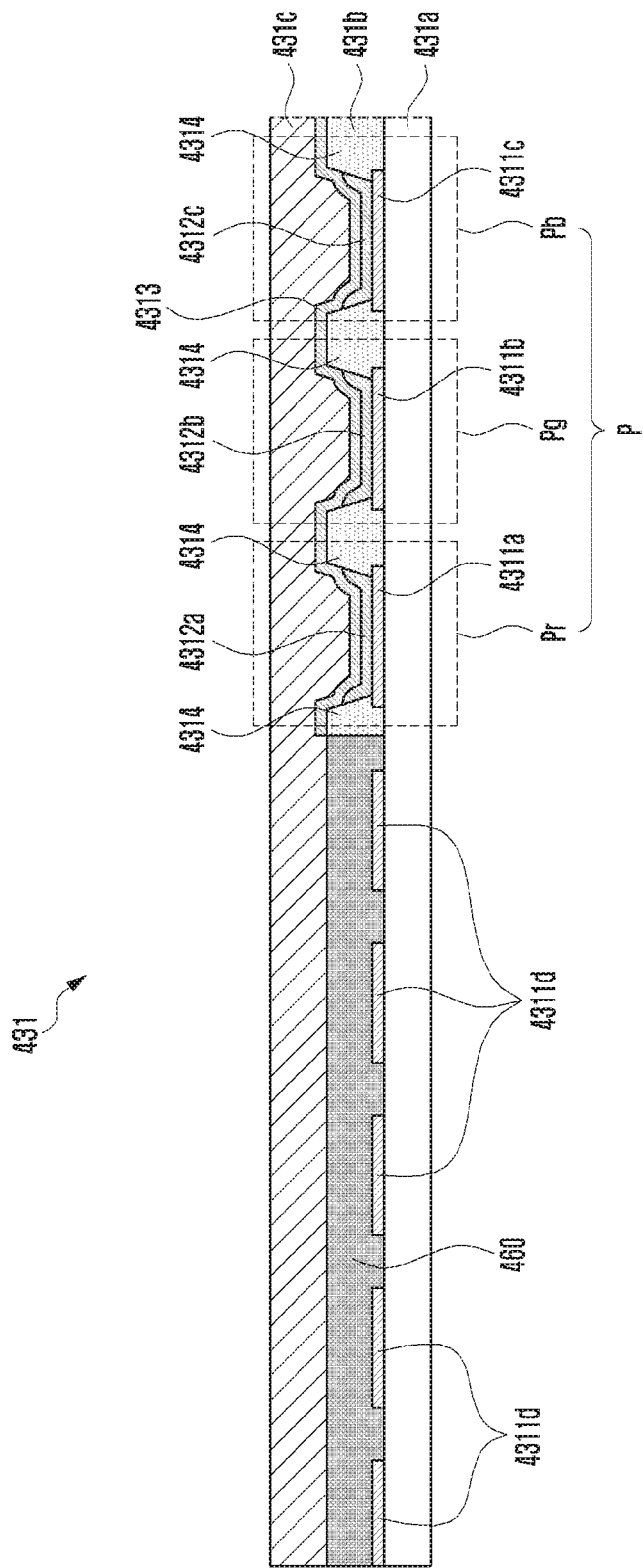
FIG. 7 is a partial cross-sectional view of a display panel with an area C of FIG. 6A enlarged according to various embodiments of the disclosure.

FIG. 7 is a partial cross-sectional view of a display panel 431 with an area C of FIG. 6A enlarged according to various embodiments of the disclosure.

With reference to FIG. 7, the display panel 431 may include a substrate layer 431a, an intermediate layer 431b laminated on the substrate layer 431a, and an encapsulation (encap) layer 431c laminated on the intermediate layer 431b. According to an embodiment, the display panel 431 may include a plurality of pixels, each of which may include a first sub-pixel area (pixel red (Pr)), a second sub-pixel area (pixel green (Pg)), and a third sub-pixel area (pixel blue (Pb)). According to an embodiment, the area in which the plurality of pixels are disposed may include the active area of the display panel 431.

According to various embodiments, the display panel 431 may include a first pixel electrode 4311a, a second pixel electrode 4311b, and a third pixel electrode 4311c being disposed on the substrate layer 431a to correspond to the first sub-pixel area (Pr), the second sub-pixel area (Pg), and the third sub-pixel area (Pb) in the intermediate layer 431b. According to an embodiment, the display panel 431 may include a first organic material layer 4312a, a second organic material layer 4312b, and a third organic material layer 4312c respectively disposed on upper portions of the first to third pixel electrodes 4311a, 4311b, and 4311c, respectively, in the intermediate layer 431b. According to an embodiment, the first to third sub-pixel areas (Pr, Pg, and Pb) may be partitioned by a pixel defining layer 4314 of, for example, an insulation material, and an opposite electrode 4313 may be commonly disposed on the first to third organic material layers 4312a, 4312b, and 4312c. According to an embodiment, the first to third pixel electrodes 4311a, 4311b, and 4311c may be reflective electrodes including reflective layers. For example, the reflective layer may include, for example, and without limitation, at least any one selected from the group including silver (Ag), magnesium (Mg), aluminum (Al), platinum (Pt), palladium (Pd), gold (Au), nickel (Ni), neodymium (Nd), iridium (Ir), chrome (Cr), or the like, and on the reflective layer, a transparent or semi-transparent electrode layer formed, for example, and without limitation, by at least any one selected from the group including indium tin oxide (ITO), indium zinc oxide (IZO), zinc oxide (ZnO), indium oxide ($In_2O_3$), indium gallium oxide (IGO), aluminum zinc oxide (AZO), or the like, may be further disposed.

According to various embodiments, each of the first to third organic material layers 4312a, 4312b, and 4312c may include an organic light-emitting layer emitting light of a first color, a second color, and a third color. According to an embodiment, the organic light-emitting layer may be disposed between a pair of common layers vertically laminated. According to an embodiment, one common layer may include a hole injection layer (HIL) and/or a hole transport layer (HTL). According to an embodiment, the other common layer may include an electron transport layer (ETL) and/or an electron injection layer (EIL). However, the common layers are not limited thereto, but may further include various functional layers while including the organic light-emitting layer. According to an embodiment, the above-described first to third colors may be red, green, and blue, respectively. However, the first to third colors are not limited thereto, but other various color combinations may be used in addition to combinations of red, green, and blue if they can emit a white light.

According to various embodiments, the opposite electrode 4313 may include a transparent or semi-transparent electrode, and may include, for example, and without limitation, one or more materials selected from silver (Ag), aluminum (Al), magnesium (Mg), lithium (Li), calcium (Ca), copper (Cu), LiF/Ca, LiF/Al, MgAg, CaAg, or the like, and may be formed of a thin film having a thickness of several to several tens of nanometers (nm). According to an embodiment, the light emitted from the first to third organic light-emitting layers included in the first to third organic material layers 4312a, 4312b, and 4312c may be emitted in the direction of the opposite electrode 4313 directly or after being reflected by the first to third pixel electrodes 4311a, 4311b, and 4311c.

According to various embodiments, the substrate layer 431a may include electrical connection members electrically connected to the first to third pixel electrodes 4311a, 4311b, and 4311c, respectively. According to an embodiment, the electrical connection member may include, for example, and without limitation, a thin film transistor (TFT), a low-temperature passivation transistor (LTPS), or the like. According to an embodiment, the encap layer 431c may be disposed on the upper portion of the opposite electrode 4313 for the protection thereof.

According to various embodiments, the display panel 431 may include the light blocking member 460 disposed on the intermediate layer 431b between the substrate layer 431a and the encap layer 431c in the blocking area (e.g., blocking area DS of FIG. 6A). According to an embodiment, in the blocking area DS, the first to third pixel electrodes 4311a, 4311b, and 4311c, the first to third organic material layers 4312a, 4312b, and 4312c, or the opposite electrode 4313 may not be disposed on the intermediate layer 431b. As another embodiment, for convenience in the manufacturing process, in the blocking area DS, the intermediate layer 431b may include only a fourth pixel electrode 4311d that is substantially the same as the first to third pixel electrodes 4311a, 4311b, and 4311c. According to an embodiment, in the process of manufacturing the display panel 431, the light blocking member 460 may include an organic material or sealant of an opaque (black) material formed together when the first to third organic material layers 4312a, 4312b, and 4312c are formed. As another embodiment, the light blocking member 460 may be replaced by the first to third pixel electrodes 4311a, 4311b, and 4311c disposed on the upper portion of the substrate 431a with a high disposition density on the intermediate layer 431b. As another embodiment, the light blocking member 460 may be separately disposed or printed using an opaque material (ink or resin). As another embodiment, the light blocking member 460 may be formed using the existing opaque constituent element (electrode or wiring) inside the display.

Figure 8:
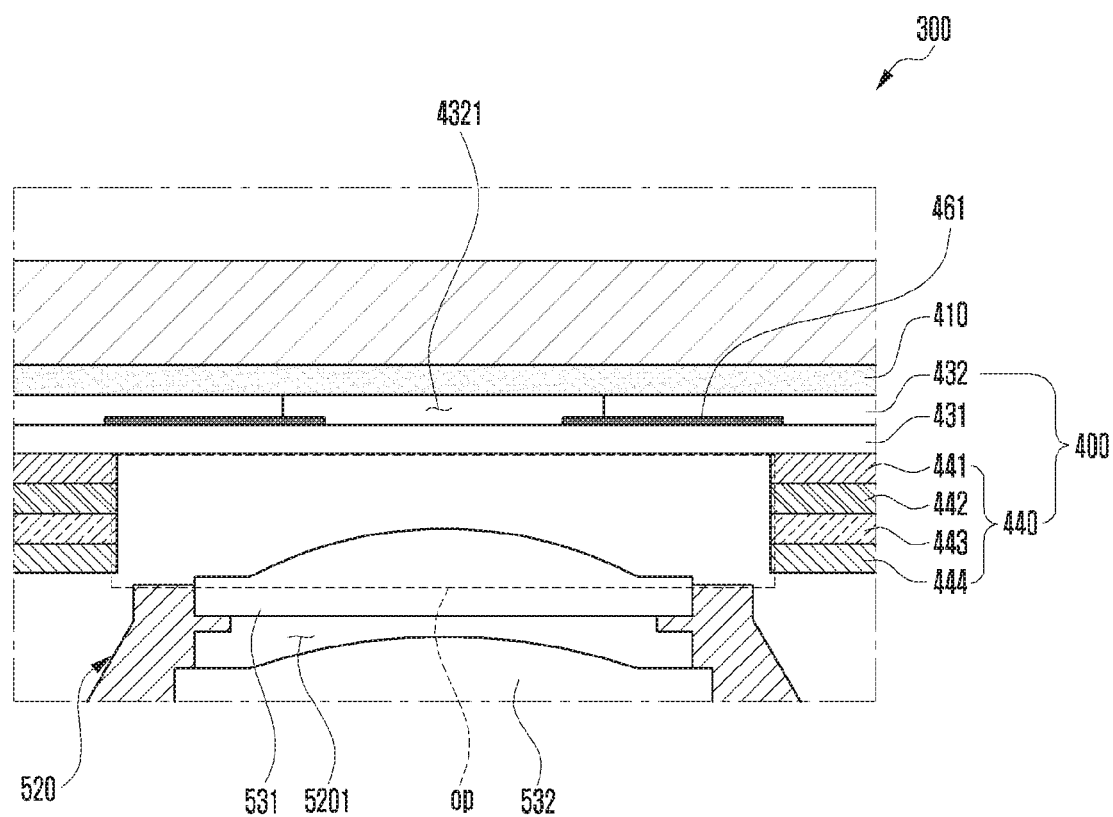
FIG. 8 is a partial cross-sectional view of an electronic device including a light blocking member disposed on a display according to various embodiments of the disclosure.
Figure 9:
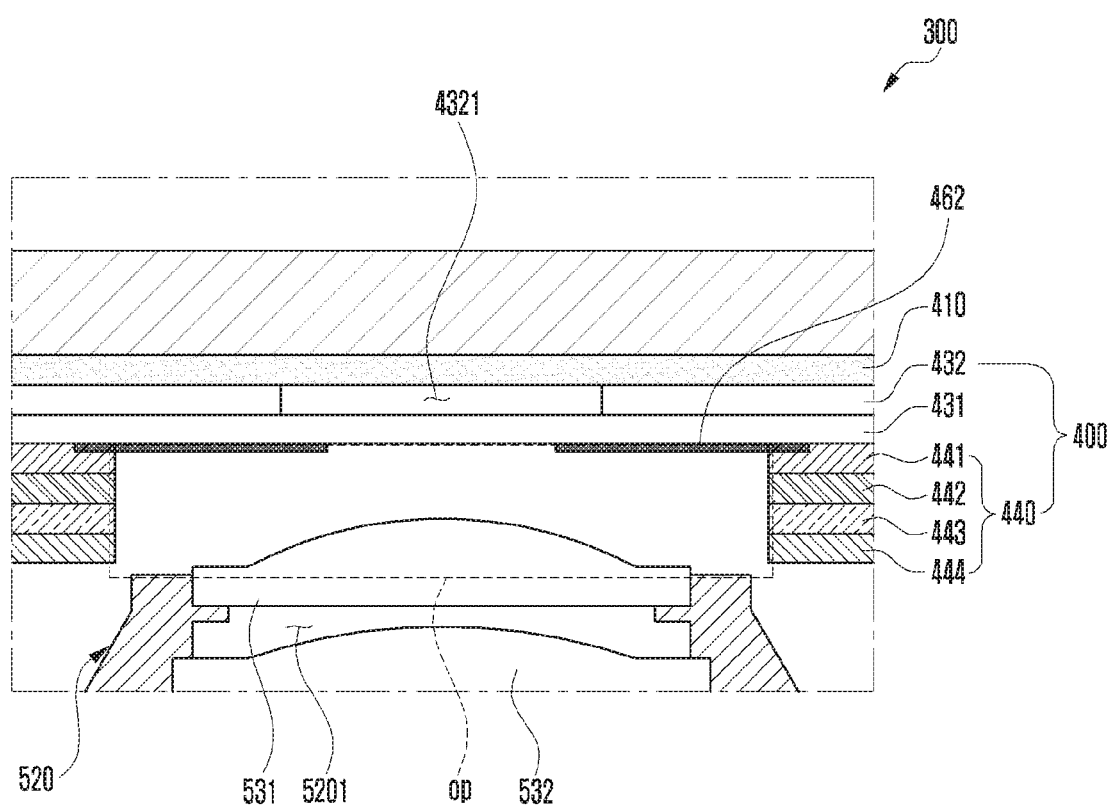
FIG. 9 is a partial cross-sectional view of an electronic device including a light blocking member disposed on a display according to various embodiments of the disclosure.

FIGS. 8 and 9 are partial cross-sectional views of an electronic device including light blocking members 461 and 462 disposed on a display according to various embodiments of the disclosure.

In describing the configuration of the electronic device 300 of FIGS. 8 and 9, the same reference numerals are given to substantially the same elements of the electronic device 300 of FIG. 6A, and the detailed description thereof may not be repeated.

With reference to FIG. 8, the light blocking member 461 may be disposed between the display panel 431 and the POL 432. According to an embodiment, the light blocking member 461 may be disposed on the upper surface of the display panel 431 or the rear surface of the POL 432.

With reference to FIG. 9, the light blocking member 462 may be disposed between the display panel 431 and the subsidiary material layer 440. According to an embodiment, the light blocking member 462 may be disposed on the rear surface of the display panel 431 or the upper surface of the subsidiary material layer 444.

According to various embodiments, the size of the light transmission region of the light blocking member 461 and 462 may be determined in accordance with the separation distance from the camera module 500 and/or the predetermined viewing angle of the camera module 500. According to an embodiment, the light blocking member 461 and 462 may include a light blocking material, such as, for example, and without limitation, a black printed layer, a black matrix (BM), an opaque tape member, or the like.

As another embodiment, the light blocking member 461 and 462 may be disposed to at least partly overlap the opening 4321 as seen from above the electronic device 300.

According to an embodiment, the light blocking member 461 and 462 may be disposed between various layers. For example, the light blocking member may be disposed between the adhesive member 410 and the POL 432. As another embodiment, the light blocking member 461 and 462 may be disposed to at least partly overlap each other in at least two areas between the display panel 431 and the POL 432, between the display panel 431 and the subsidiary material layer 440, inside the display panel 431, or between the adhesive member 410 and the POL 432.

Figure 10:
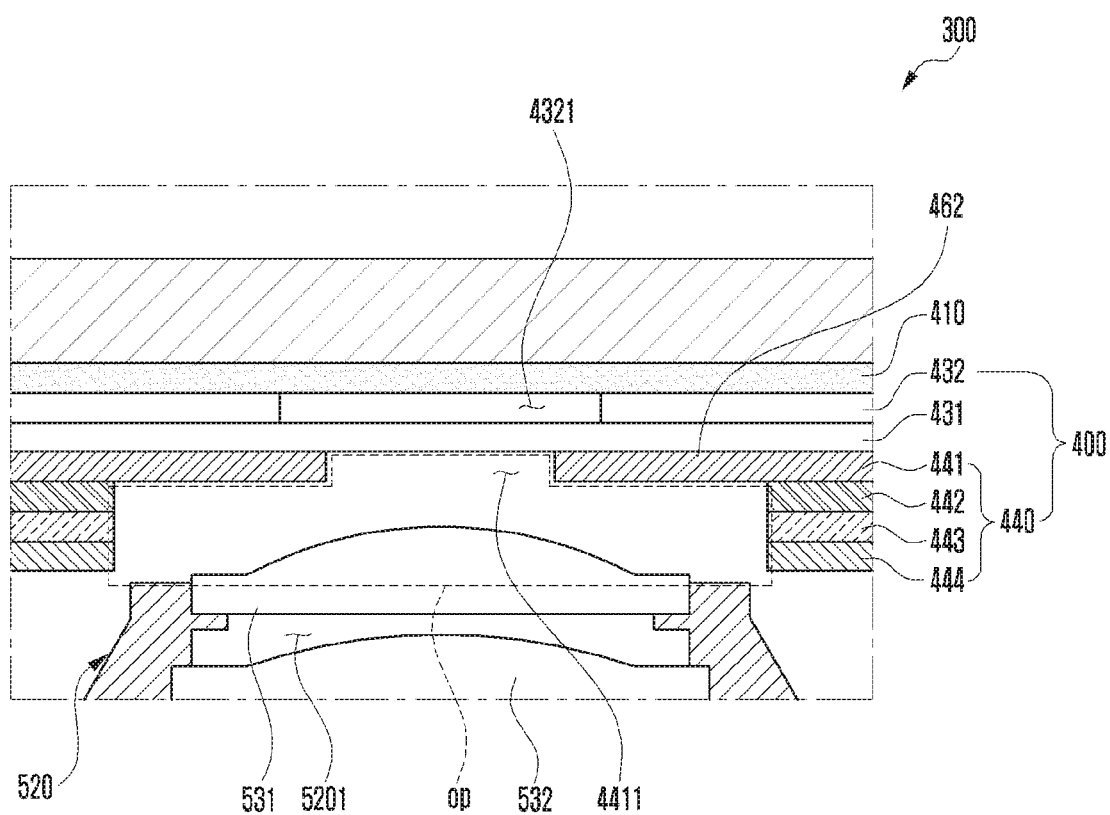
FIG. 10 is a partial cross-sectional view of an electronic device according to various embodiments of the disclosure.

FIG. 10 is a partial cross-sectional view of an electronic device 300 according to various embodiments of the disclosure.

In describing the configuration of the electronic device 300 of FIG. 10, the same reference numerals are given to substantially the same elements as those of the electronic device 300 of FIG. 6A, and the detailed description thereof may not be repeated.

With reference to FIG. 10, the light blocking member may be disposed or shaped so that a separate member is not added, and at least one of elements 441, 442, 443, and 444 of the subsidiary material layer 440 disposed on the rear surface of the display panel 431 may serve as the light blocking member. For example, of the subsidiary material layer 440, at least a part of the shading layer 441 of the opaque material facing the display panel 431 may be used as the light blocking member. In this example, compared with the openings (e.g., openings 4421, 4431, and 4441 of FIG. 4) formed on other neighboring subsidiary material layers (e.g., the buffer layer 442, functional member 443, and conductive member 444), the opening 4411 of the shading layer 441 may be formed in the shape of the light transmission region (e.g., light transmission region AD of FIG. 6A) corresponding to the camera module 500. As another embodiment, the light blocking member may be formed through at least two layers of the subsidiary material layers 440.

According to various embodiments of the disclosure, because the camera module is disposed under the display panel and the opening is not formed on the corresponding area, it may be advantageous in manufacturing the display panel, and because the light blocking member performing an aperture function is disposed on the display and the printing area (BM area) disposed on the cover member is excluded, the camera exposure area can be reduced.

According to various example embodiments, an electronic device (e.g., electronic device 300 of FIG. 5) may include: a housing (e.g., housing 310 of FIG. 5), a display (e.g., display 400 of FIG. 5) disposed in an internal space (e.g., internal space 3001 of FIG. 5) of the housing to be viewable from an outside and including a display area, and a camera module (e.g., camera module 500 of FIG. 5) disposed under the display overlapping at least a part of the display area, the camera module not including an aperture structure, wherein the camera module includes: a lens housing (e.g., lens housing 520 of FIG. 5), a plurality of lenses (e.g., plurality of lenses 530 of FIG. 5) disposed on the lens housing, and an image sensor (e.g., image sensor 540 of FIG. 5) disposed under the plurality of lenses, wherein the display includes: a display panel (e.g., display panel 431 of FIG. 5) and a light blocking member (light blocking member 460 of FIG. 6A) comprising a light blocking material and including a light transmission region (e.g., light transmission region AD of FIG. 6A) disposed on an inside and/or an outside of the display panel overlapping at least parts of the plurality of lenses as viewed from above the display.

According to various example embodiments, the display panel may include a substrate layer; an intermediate layer including a plurality of pixel electrodes laminated on an upper portion of the substrate layer, organic light-emitting layers disposed on the plurality of pixel electrodes, respectively, and an opposite electrode disposed on upper portions of the organic light-emitting layers; and an encapsulation layer disposed on an upper portion of the intermediate layer, wherein the light blocking member is disposed on the intermediate layer.

According to various example embodiments, the light blocking member may include an organic material having reflectivity of about 99% or more with respect to light flowing into the light blocking member.

According to various example embodiments, the light blocking member may be disposed together based on the organic light-emitting material being disposed.

According to various example embodiments, the size of the light transmission region of the light blocking member may be determined based on a viewing angle of the camera module.

According to various example embodiments, an area overlapping the light transmission region of the display panel may not include the organic light-emitting layers as viewed from above the display.

According to various example embodiments, the electrodes may not be disposed in an area overlapping the light transmission region of the display panel as viewed from above the display.

According to various example embodiments, a disposition density of the plurality of electrodes and/or the organic light-emitting layers may be configured to be lower than a disposition density of the neighboring display area in an area overlapping the light transmission region of the display panel as viewed from above the display.

According to various example embodiments, the display may include a polarizing member (POL) including a polarizer laminated on an upper portion of the display panel, and at least a part of the light blocking member may be disposed between the polarizing member and the display panel.

According to various example embodiments, the light blocking member may include at least one of a black printed layer, a black matrix, or an opaque tape member being disposed on the upper portion of the display panel and/or a rear side of the polarizing member.

According to various example embodiments, the polarizing member may include an opening corresponding to the light transmission region as viewed from above the display.

According to various example embodiments, the display may include a polarizing member (POL) laminated on an upper portion of the display panel, and the light blocking member may be disposed on an upper surface of the polarizing member.

According to various example embodiments, the display may include at least one subsidiary material layer laminated on a lower portion of the display panel, and the light blocking member may be disposed between the subsidiary material layer and the display panel.

According to various example embodiments, the at least one subsidiary material layer may include an opening corresponding to the light transmission region as viewed from above the display.

According to various example embodiments, the camera module may be at least partially disposed in the opening.

According to various example embodiments, the light blocking member may include an opaque printed layer formed on a rear surface of the display panel.

According to various example embodiments, the at least one subsidiary material layer may include at least one polymer layer disposed on a rear surface of the display panel, a functional member comprising a heat dissipating material layer disposed under the at least one polymer layer, and a conductive plate disposed under the functional member layer, wherein the light blocking member may be replaced by the at least one polymer layer.

According to various example embodiments, the light transmission region may be formed through the opening having the same center as centers of the plurality of lenses on the at least one polymer layer.

According to various example embodiments, the at least one polymer layer may include a shading layer of an opaque material.

While the disclosure has been illustrated and described with reference to various example embodiments thereof, it will be understood that the various example embodiments are intended to be illustrative, not limiting. It will be further understood by one of ordinary skill in the art that various changes in form and detail may be made without departing from the true spirit and full scope of the disclosure, including the appended claims and equivalents thereof.

What is claimed is:

1. An electronic device comprising:
  a housing;
  a display disposed in an internal space of the housing to be viewable from an outside and including a display area; and
  a camera module disposed under the display overlapping at least a part of the display area and not including an aperture structure,
  wherein the camera module includes:
    a lens housing;
    a plurality of lenses disposed on the lens housing; and
    an image sensor disposed under the plurality of lenses,
  wherein the display includes:
    a display panel; and
    a light blocking member disposed inside of the display panel, the light blocking member comprising light blocking material and a light transmission region surrounded at least partially by the light blocking material,
  wherein the light transmission region overlaps at least parts of the plurality of lenses when the display is viewed from above,
  wherein the display panel comprises:
    a substrate layer;
    an intermediate layer including a plurality of pixel electrodes laminated on an upper portion of the substrate layer, organic light-emitting layers disposed on the plurality of pixel electrodes, respectively, and an opposite electrode disposed on upper portions of the organic light-emitting layers; and
    an encapsulation layer disposed on an upper portion of the intermediate layer, wherein the light blocking member is disposed at the intermediate layer.

2. The electronic device of claim 1, wherein the light blocking member comprises an organic material having a reflectivity of about 99% or more with respect to light flowing into the light blocking member.

3. The electronic device of claim 1, wherein the light blocking member is disposed together with the organic light-emitting layers.

4. The electronic device of claim 1, wherein a size of the light transmission region of the light blocking member is determined based on a viewing angle of the camera module.

5. The electronic device of claim 1, wherein an area overlapping the light transmission region of the display panel does not include the organic light-emitting layers as viewed from above the display.

6. The electronic device of claim 1, wherein the plurality of pixel electrodes are not disposed in an area overlapping the light transmission region of the display panel as viewed from above the display.

7. The electronic device of claim 1, wherein a disposition density of the plurality of pixel electrodes and/or the organic light-emitting layers is less than a disposition density of a neighboring display area in an area overlapping the light transmission region of the display panel as viewed from above the display.

8. An electronic device comprising:
  a housing;
  a display disposed in an internal space of the housing to be viewable from an outside and including a display area; and a camera module disposed under the display overlapping at least a part of the display area and not including an aperture structure,
wherein the camera module includes:
  a lens housing;
  a plurality of lenses disposed on the lens housing; and
  an image sensor disposed under the plurality of lenses,
wherein the display includes:
  a display panel;
  a polarizer laminated on an upper portion of the display panel; and
  a light blocking member disposed between at least the polarizer and the display panel, the light blocking member comprising light blocking material and a light transmission region surrounded at least partially by the light blocking material,
  wherein the light transmission region overlaps at least parts of the plurality of lenses when the display is viewed from above.

9. The electronic device of claim 8, wherein the light blocking member comprises at least one of a black printed layer, a black matrix, or an opaque tape disposed on the upper portion of the display panel and/or a rear side of the polarizer.

10. The electronic device of claim 8, wherein the polarizer includes an opening corresponding to the light transmission region as viewed from above the display.

11. An electronic device comprising:
a housing;
a display disposed in an internal space of the housing to be viewable from an outside and including a display area; and
a camera module disposed under the display overlapping at least a part of the display area and not including an aperture structure,
wherein the camera module includes:
  a lens housing;
  a plurality of lenses disposed on the lens housing; and
  an image sensor disposed under the plurality of lenses,
wherein the display includes:
  a display panel;
  at least one subsidiary material layer laminated on a lower portion of the display panel; and
  a light blocking member disposed between the at least one subsidiary material layer and the display panel, the light blocking member comprising light blocking material and a light transmission region surrounded at least partially by the light blocking material,
  wherein the light transmission region overlaps at least parts of the plurality of lenses when the display is viewed from above.

12. The electronic device of claim 11, wherein the at least one subsidiary material layer includes an opening corresponding to the light transmission region when the display is viewed from above.

13. The electronic device of claim 12, wherein the camera module is disposed at least partially in the opening.

14. The electronic device of claim 11, wherein the light blocking member comprises an opaque printed layer disposed on a rear surface of the display panel.

15. The electronic device of claim 11, wherein the at least one subsidiary material layer comprises:
at least one polymer layer disposed on a rear surface of the display panel;
a functional member layer comprising a heat dissipating material disposed under the at least one polymer layer; and
a conductive plate disposed under the functional member layer, and
wherein the light blocking member is replaced by the at least one polymer layer.

16. The electronic device of claim 15, wherein the light transmission region has the same center as centers of the plurality of lenses on the at least one polymer layer.

17. The electronic device of claim 16, wherein the at least one polymer layer comprises a shading layer comprising an opaque material.

* * * * *